(12) United States Patent
Cheng et al.

(10) Patent No.: US 12,499,792 B2
(45) Date of Patent: Dec. 16, 2025

(54) ELECTRONIC DEVICE AND MANUFACTURING METHOD THEREOF

(71) Applicant: Innolux Corporation, Miaoli County (TW)

(72) Inventors: Kai Cheng, Miaoli County (TW);
Fang-Ying Lin, Miaoli County (TW);
Ming-Chang Lin, Miaoli County (TW);
Tsau-Hua Hsieh, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 172 days.

(21) Appl. No.: 18/468,752

(22) Filed: Sep. 18, 2023

(65) Prior Publication Data

US 2024/0135846 A1   Apr. 25, 2024
US 2024/0233590 A9   Jul. 11, 2024

(30) Foreign Application Priority Data

Oct. 25, 2022   (CN) .......................... 202211326566.4

(51) Int. Cl.
   *G09G 3/00*   (2006.01)
   *H01L 25/075*   (2006.01)
   *H10H 20/857*   (2025.01)

(52) U.S. Cl.
   CPC .......... *G09G 3/006* (2013.01); *H01L 25/0753* (2013.01); *H10H 20/857* (2025.01); *G09G 2330/12* (2013.01)

(58) Field of Classification Search
   CPC ...... H01L 25/0753; H01L 2221/68322; G09G 2330/12
   See application file for complete search history.

(56) References Cited

U.S. PATENT DOCUMENTS

| | | | |
|---|---|---|---|
| 2007/0031982 A1* | 2/2007 | Lim | G01N 21/9501 356/237.1 |
| 2019/0044518 A1* | 2/2019 | Subbareddy | G06F 30/30 |
| 2020/0152827 A1* | 5/2020 | Chen | H10H 20/857 |
| 2020/0321391 A1* | 10/2020 | Danesh | H10H 29/142 |

FOREIGN PATENT DOCUMENTS

CN   105144387   12/2015

\* cited by examiner

*Primary Examiner* — Huy Q Phan
*Assistant Examiner* — Temilade S Rhodes-Vivour
(74) *Attorney, Agent, or Firm* — JCIPRNET (57) ABSTRACT

An electronic device and a manufacturing method thereof are provided. The manufacturing method of the electronic device includes the following. A substrate is provided. A plurality of electronic units are transferred to the substrate. The electronic units are inspected to obtain M first defect maps. The M first defect maps are integrated into N second defect maps, where N<M. M repairing groups are provided according to the N second defect maps. Each of the repairing groups includes at least one repairing electronic unit. The M repairing groups are transferred to the substrate. At least two of the repairing groups have the same location distribution of repairing electronic units, and the location distribution is consistent with a defect distribution of one of the second defect maps.

19 Claims, 6 Drawing Sheets

ELECTRONIC DEVICE AND MANUFACTURING METHOD THEREOF

CROSS-REFERENCE TO RELATED APPLICATION

This application claims the priority benefit of Chinese application no. 202211326566.4, filed on Oct. 25, 2022. The entirety of the above-mentioned patent application is hereby incorporated by reference herein and made a part of this specification.

BACKGROUND

Technical Field

The disclosure relates to an electronic device and a manufacturing method thereof.

Description of Related Art

In current mass transfer technology, electronic units are transferred to the same substrate by transfer heads. If the transfer heads are prepared based on the consideration of a transfer defective rate, a transfer head defective rate, or the like, the number of transfer heads to be prepared may increase, which increases management difficulty or cost.

SUMMARY

The disclosure provides an electronic device and a manufacturing method thereof that help reduce the number of transfer heads to be prepared.

In an embodiment of the disclosure, a manufacturing method of an electronic device includes the following. A substrate is provided. A plurality of electronic units are transferred to the substrate. The electronic units are inspected to obtain M first defect maps. The M first defect maps are integrated into N second defect maps, where N<M. M repairing groups are provided according to the N second defect maps. Each of the repairing groups includes at least one repairing electronic unit. The M repairing groups are transferred to the substrate. At least two of the repairing groups have the same location distribution of repairing electronic units, and the location distribution is consistent with a defect distribution of one of the second defect maps.

In another embodiment of the disclosure, an electronic device includes a substrate, a plurality of electronic unit groups, and at least two repairing groups. The substrate includes a plurality of transfer regions. Each of the transfer regions includes a plurality of bonding regions. Each of the bonding regions includes a main bonding region and a backup bonding region. The electronic unit groups are respectively disposed on the transfer regions. Each of the electronic unit groups includes a plurality of electronic units respectively bonded to the main bonding regions. The at least two repairing groups are respectively disposed on at least two of the transfer regions. Each of the repairing groups includes at least one repairing electronic unit bonded to at least one of the backup bonding regions. At least two of the repairing groups have the same location distribution of repairing electronic units, and the number of the repairing electronic units in each of the repairing groups is less than the number of the backup bonding regions in each of the transfer regions.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Reference will now be made in detail to the exemplary embodiments of the disclosure, examples of which are illustrated in the accompanying drawings. Wherever possible, the same reference numerals are used in the drawings and description to refer to the same or like parts.

Some terms are used to refer to specific elements throughout the description and the appended claims of the disclosure. A person skilled in the art should understand that an electronic device manufacturer may use different names to refer to the same elements. The disclosure is not intended to distinguish elements that have the same functions but different names. In the description and the claims hereinafter, terms such as "include", "comprise", and "have' are open-ended terms, and should thus be interpreted as "including, but not limited to".

The directional terms mentioned herein, like "above", "below", "front", "rear", "left", "right", and the like, refer only to the directions in the accompanying drawings. Therefore, the directional terms are used for describing instead of limiting the disclosure. Each of the drawings illustrate typical features of methods, structures, and/or materials used in specific embodiments. Nonetheless, the drawings should not be interpreted as defining or limiting ranges or properties encompassed by these embodiments. For example, the relative sizes, thicknesses, and positions of film layers, regions, and/or structures may be reduced or enlarged for clarity.

In the disclosure, when a structure (or layer, element, substrate) is described as being located on/above another structure (or layer, element, substrate), it may refer to the case that the two structures are adjacent and directly connected, or the two structures are adjacent but not directly connected. Non-direct connection refers to the case that at least one intermediary structure (or intermediary layer, intermediary element, intermediary substrate, intermediary spacing) is present between the two structures, where a lower side surface of one structure is adjacent to or directly connected to an upper side surface of the intermediary structure, and an upper side surface of the other structure is adjacent to or directly connected to a lower side surface of the intermediary structure. The intermediary structure may be composed of a single-layer or multi-layer physical structure or non-physical structure with no limitation. In the disclosure, when a structure is disposed "on" another structure, it is possible that the structure is "directly" on the another structure, or the structure is "indirectly" on the another structure, namely at least one structure is further sandwiched between the structure and the another structure.

The terms "about", "equal", "equivalent", "same", "substantially", or "essentially" are generally interpreted as that a value is within 20% of a given value or range, or within 10%, 5%, 3%, 2%, 1%, or 0.5% of a given value or range. In addition, the description "the range is from a first value to a second value" or "the range falls within a range of a first value to a second value" indicates that the range includes the first value, the second value, and other values in between.

In the description and the claims, the use of an ordinal number such as "first", "second", and so on to modify an element does not by itself connote or represent any preceding ordinal number of the element(s); any priority, precedence, or order of one element over another; or the order in which a manufacturing method is performed, but only to clearly distinguish an element having a certain name from another element having the same name. The same terms may be not used in the claims as used in the description, and accordingly a first member in the description may be a second member in the claims.

The term electrically connection or coupling described in the disclosure refers to direct or indirect connection. In the case of direct connection, end points of elements on two circuits are directly connected or interconnected by a conductor line segment. In the case of indirect connection, present between end points of elements on two circuits is a switch, a diode, a capacitor, an inductor, other suitable elements, or a combination of the above elements, but not limited thereto.

In the disclosure, a thickness, a length, and a width may be measured using an optical microscope (OM), and the thickness or width may be measured from a cross-sectional image shown in an electron microscope, but not limited thereto. In addition, certain errors may exist between any two values or directions for comparison. In addition, if a first direction is perpendicular to a second direction, the angle between the first direction and the second direction may be between 80 degrees and 100 degrees. If a first direction is parallel to a second direction, the angle between the first direction and the second direction may be between 0 degree and 10 degrees.

It should be noted that features in different embodiments below may be replaced, recombined, or mixed with each other to form other embodiments without departing from the spirit of the disclosure. Features in the embodiments may be arbitrarily used in mixture without departing from the spirit of the disclosure or conflicting with each other.

Unless otherwise defined, all terms (including technical and scientific terms) used herein have the same meaning as commonly understood by one of ordinary skill in the art related to the disclosure. It will be understood that terms, such as those defined in commonly used dictionaries, should be interpreted as having a meaning that is consistent with their meaning in the background or the context of the relevant art and the disclosure and will not be interpreted in an idealized or overly formal sense unless particularly so defined in the embodiments of the disclosure.

In the disclosure, an electronic device may include a display device, a backlight device, an antenna device, a sensing device, or a tiled device, but not limited thereto. The electronic device may be a bendable or flexible electronic device. The display device may be a non-self-luminous-mode display device or a self-luminous-mode display device. The electronic device may include, for example but not limited to, a liquid crystal, a light-emitting diode (LED), fluorescence, phosphor, a quantum dot (QD), other suitable display media, or a combination thereof. The antenna device may be in a liquid crystal form or in a non-liquid crystal form, and the sensing device may sense capacitance, light rays, thermal energy, or ultrasonic waves, but not limited thereto. In the disclosure, the electronic device may include an electronic unit, and the electronic unit may include a passive element or an active element, such as a capacitor, a resistor, an inductor, a diode, a transistor, or the like. The diode may include an LED or a photodiode. The LED may include, for example but not limited to, an organic light-emitting diode (OLED), a mini LED, a micro LED, or a quantum dot (QD) LED (e.g., QLED or QDLED). The tiled display device may be a tiled display device or a tiled antenna device, for example but not limited thereto. It should be noted that the electronic device may be any arrangement or combination of the above, but is not limited thereto. In addition, the electronic device may have a shape of a rectangle, a circle, or a polygon, a shape with curved edges, or other suitable shapes. The electronic device may have peripheral systems such as a driving system, a control system, a light source system, or the like to support a display device, an antenna device, a wearable device (including augmented reality or virtual reality, for example), a vehicle mounted device (including an automotive windshield, for example), or a tiled device.

FIG. 1A to FIG. 1E are respectively schematic partial top views of a manufacturing process of an electronic device according to some embodiments of the disclosure. FIG. 2A to FIG. 2C are respectively schematic enlarged views of a bonding region B1 to a bonding region B3 in FIG. 1E. Refer may be made to FIG. 2C for a schematic enlarged view of a bonding region B4 in FIG. 1E.

Figure 1A:
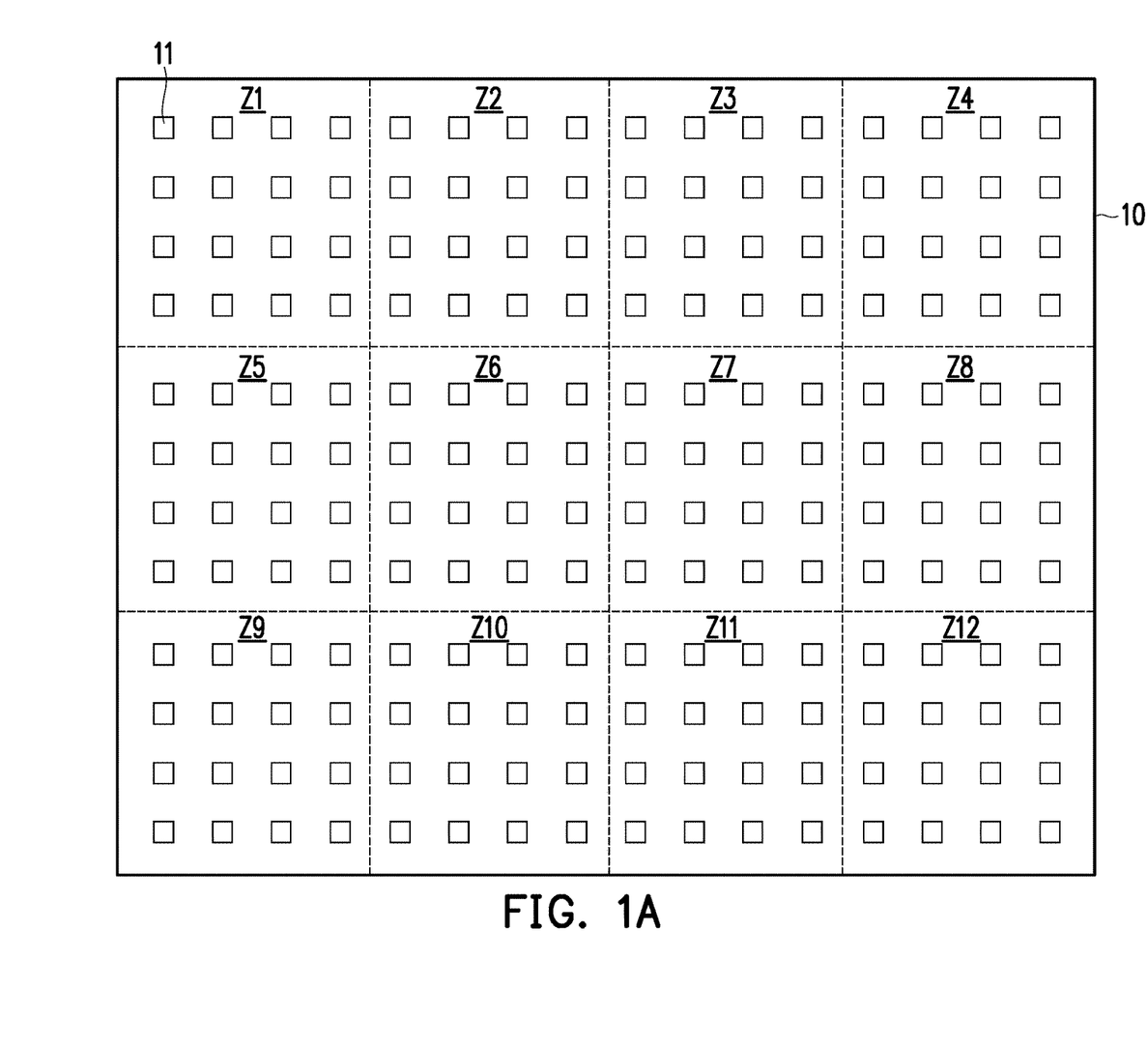
FIG. 1A to FIG. 1E are respectively schematic partial top views of a manufacturing process of an electronic device according to some embodiments of the disclosure.
Figure 2A:
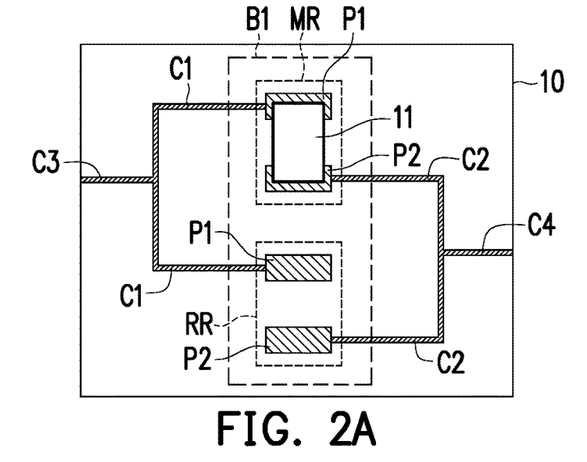
FIG. 2A to FIG. 2C are respectively schematic enlarged views of a bonding region B1 to a bonding region B3 in FIG. 1E.
Figure 2B:
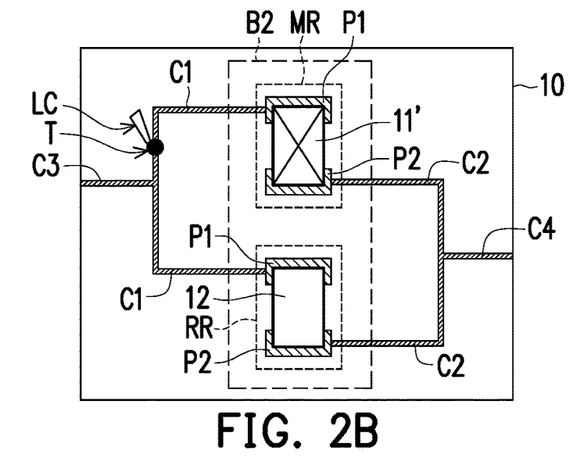
Figure 2C:
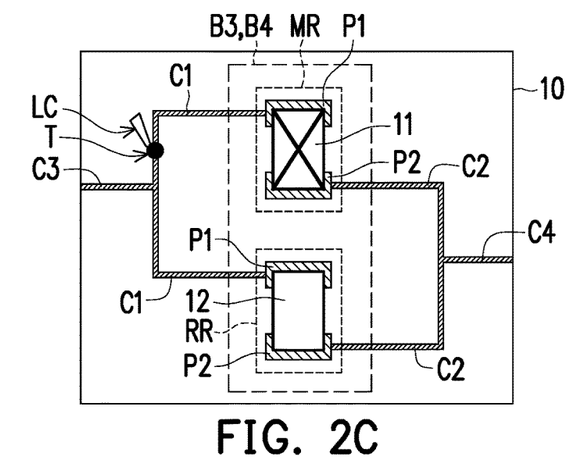

First, with reference to FIG. 1A, a manufacturing method of an electronic device may include providing a substrate 10. The substrate 10 may be a rigid substrate or a flexible substrate. The material of the substrate 10 includes glass, quartz, ceramic, sapphire, or plastic, for example but not limited thereto. The plastic may include polycarbonate (PC), polyimide (PI), polypropylene (PP), polyethylene terephthalate (PET), other suitable flexible materials, or a combination thereof, but not limited thereto. In addition, the light transmittance of the substrate 10 is not limited. In other words, the substrate 10 may be a transparent substrate, a semi-transparent substrate, or an opaque substrate.

In some embodiments, although not shown in FIG. 1A, a circuit may be disposed on the substrate 10. Taking FIG. 2A to FIG. 2C as an example, a plurality of pads P1, a plurality of pads P2, a plurality of lead wires C1, a plurality of lead wires C2, a plurality of lead wires C3, and a plurality of lead wires C4 may be disposed on the substrate 10, but not limited thereto. Each pad P2 is disposed adjacent to one corresponding pad P1. The first end of each lead wire C1 is electrically connected to one corresponding pad P1, and the second end of each lead wire C1 is electrically connected to one corresponding lead wire C3. The first end of each lead wire C2 is electrically connected to one corresponding pad P2, and the second end of each lead wire C2 is electrically connected to one corresponding lead wire C4. The pads (including the pads P1 and the pads P2) and the lead wires (including the lead wires C1, the lead wires C2, the lead wires C3, and the lead wires C4) may be in the same conductive layer or different conductive layers. If the pads and the lead wires are in different conductive layers, although not shown, one or more insulating layers may be disposed between the two conductive layers, and the pads may be respectively electrically connected to the lead wires through a plurality of vias penetrating the one or more insulating layers.

With reference to FIG. 1A, the manufacturing method of an electronic device may further include transferring a plurality of electronic units 11 to the substrate 10. In some embodiments, although not shown in FIG. 1A, at least one electronic unit 11 is transferred from a carrier to the substrate 10 by a transfer head. The electronic unit 11 may be a light-emitting diode (LED), for example but not limited to, a mini LED or a micro LED. The carrier may be a growth substrate of the electronic unit 11, or a carrier for temporarily fixing the electronic unit 11 thereon. The substrate 10 may include a plurality of transfer regions, for example but not limited to, a transfer region Z1, a transfer region Z2, a transfer region Z3, a transfer region Z4, a transfer region Z5, a transfer region Z6, a transfer region Z7, a transfer region Z8, a transfer region Z9, a transfer region Z10, a transfer region Z11, and a transfer region Z12. In addition, the electronic units 11 may be transferred to the transfer regions (e.g., the transfer region Z1 to the transfer region Z12) by a plurality of transfer heads (e.g., 12 or more transfer heads; not shown).

Each transfer region may include a plurality of bonding regions. For clarity of the drawings, FIG. 1A does not indicate the bonding regions, while FIG. 1E schematically indicates four bonding regions, for example, the bonding region B1, the bonding region B2, the bonding region B3, and bonding region B4. As shown in FIG. 2A to FIG. 2C, each bonding region may include a main bonding region MR and a backup bonding region RR. The main bonding region MR is configured to bond the electronic unit 11, and the backup bonding region RR is configured to bond a repairing electronic unit. FIG. 2A to FIG. 2C schematically show that each bonding region includes one main bonding region MR and one backup bonding region RR. Nonetheless, the respective numbers of the main bonding region MR and the backup bonding region RR in the bonding region may be changed depending on requirements, and not limited thereto. For example, each bonding region may include one main bonding region MR and a plurality of backup bonding regions RR, but not limited thereto.

Each of the main bonding region MR and the backup bonding region RR includes one pad P1 and one pad P2. In the same bonding region, the pads P1 (e.g., two pads P1) in the main bonding region MR and the backup bonding region RR are electrically connected to the same lead wire C3 via the corresponding lead wires C1 (e.g., two lead wires C1), and the pads P2 (e.g., two pads P2) in the main bonding region MR and the backup bonding region RR are electrically connected to the same lead wire C4 via the corresponding lead wires C2 (e.g., two lead wires C2). In some embodiments, the lead wire C3 is connected to a signal source, and the lead wire C4 is connected to ground, but not limited thereto.

The transferring the plurality of electronic units 11 to the substrate 10 is by, for example, mass transfer where the electronic units 11 are transferred to a plurality of main bonding regions MR in batches by transfer heads, such that each electronic unit 11 is electrically connected to one corresponding pad P1 and one corresponding pad P2. Taking FIG. 1A as an example, each transfer head transfers 16 electronic units 11 to one transfer region at one time, and 12 transfer heads transfer 192 electronic units 11 to 12 transfer regions (e.g., the transfer region Z1 to the transfer region Z12) in batches. In FIG. 1A, the number of transfer regions, the number of electronic units 11 that each transfer head can carry, or the like are exemplary, and are not intended to limit the disclosure. According to different embodiments, the transfer regions may include tens of transfer regions, and the number of electronic units 11 that each transfer head can carry may be hundreds to tens of thousands.

Figure 1B:
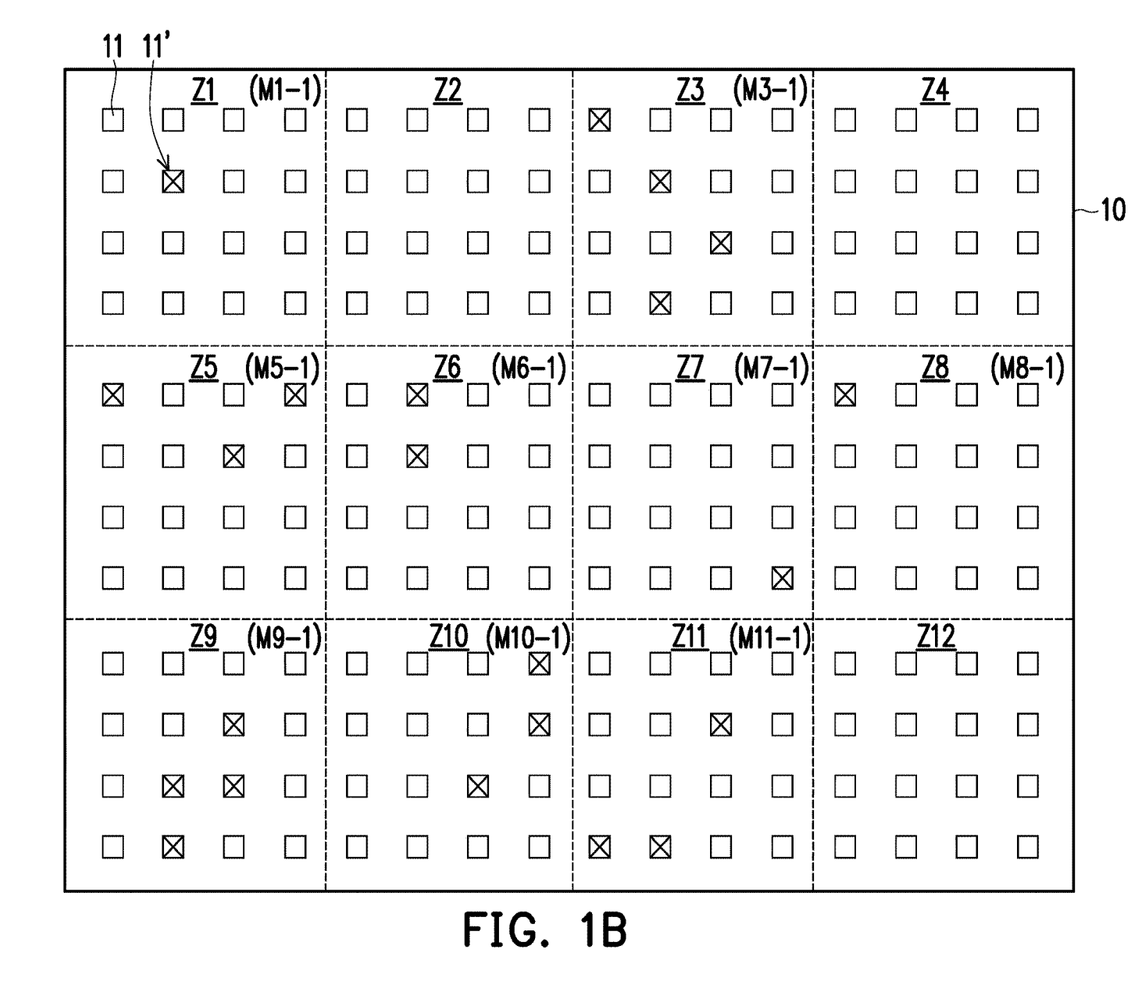

With reference to FIG. 1B, the manufacturing method of an electronic device may further include inspecting the electronic units 11 to obtain M first defect maps. For example, after the electronic units 11 are transferred to the substrate 10, a location of a defect may be determined through a light-up test, namely through providing voltages or currents via the lead wires C3 to the pads P1 (see FIG. 2A) to observe whether the electronic units 11 can be lit up. If an electronic unit 11 cannot be lit up, the electronic unit 11 is determined to be a defect 11'. For ease of identification, defect locations are indicated by crossed boxes in FIG. 1B.

In some embodiments, the first defect maps may be distinguished according to the transfer regions. If a defect is inspected in each transfer region, M is equal to the number of transfer regions; if a defect is not inspected in some of the transfer regions, M is less than the number of transfer regions. Taking FIG. 1B as an example, defects are inspected in the transfer region Z1, the transfer region Z3, and the transfer region Z5 to the transfer region Z11, and no defects are inspected in the transfer region Z2, the transfer region Z4, and the transfer region Z12, so M=9. In other words, nine first defect maps, for example, a first defect map M1-1, a first defect map M3-1, a first defect map M5-1, a first defect map M6-1, a first defect map M7-1, a first defect map M8-1, a first defect map M9-1, a first defect map M10-1, and a first defect map M11-1, are obtained after the defect inspection. In other embodiments, the first defect maps may be distinguished by a computing device or artificial intelligence (AI) according to a defect distribution or by a user, and not necessarily according to the transfer regions.

Figure 1C:
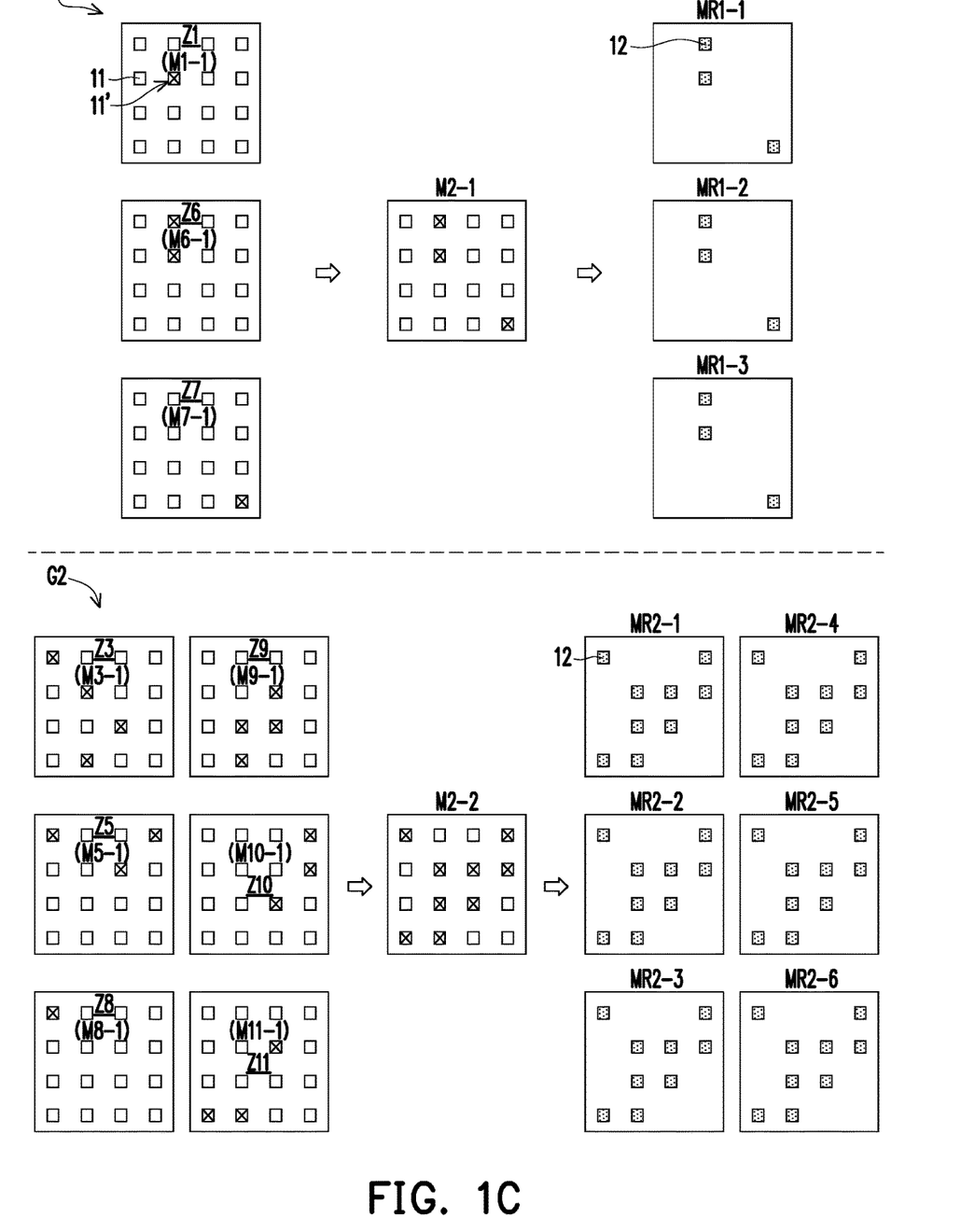

With reference to FIG. 1C, the manufacturing method of an electronic device may further include integrating the M first defect maps into N second defect maps, where N<M. For example, the M first defect maps may be divided into N groups according to factors such as the number of defects in the first defect map, repetition of defect locations, or production efficiency. In addition, each group may include at least two first defect maps. Next, a plurality of (at least two) first defect maps in a single group are integrated into one second defect map. A defect distribution of the second defect map is a union of defect distributions of the at least two first defect maps.

Taking FIG. 1C as an example, the nine first defect maps are divided into, for example, two groups (including a group G1 and a group G2), that is, N=2. The group G1 includes the first defect map M1-1, the first defect map M6-1, and the first defect map M7-1. The number of defects of the first defect map M1-1, the first defect map M6-1, and the first defect map M7-1 are respectively 1, 2, and 1, and the total number of defects of the three defect maps is 4. The group G2 includes the first defect map M3-1, the first defect map M5-1, the first defect map M8-1, the first defect map M9-1, the first defect map M10-1, and the first defect map M11-1. The number of defects of the first defect map M3-1, the first defect map M5-1, the first defect map M8-1, the first defect map M9-1, the first defect map M10-1, and the first defect map M11-1 are respectively 4, 3, 1, 4, 3, and 3, and the total number of defects of the 6 defect maps is 18.

Next, the first defect map M1-1, the first defect map M6-1, and the first defect map M7-1 are integrated into a second defect map M2-1. A defect distribution of the second defect map M2-1 is a union of defect distributions of the three first defect maps above, and the total number of defects of the second defect map M2-1 is 3. The first defect map M3-1, the first defect map M5-1, the first defect map M8-1, the first defect map M9-1, the first defect map M10-1, and the first defect map M11-1 are integrated into a second defect map M2-2. A defect distribution of the second defect map M2-2 is a union of defect distributions of the six first defect maps above, and the total number of defects of the second defect map M2-2 is 9.

The manufacturing method of an electronic device may further include providing M repairing groups, for example, a repairing group MR1-1, a repairing group MR1-2, a repairing group MR1-3, a repairing group MR2-1, a repairing group MR2-2, a repairing group MR2-3, a repairing group MR2-4, a repairing group MR2-5, and a repairing group MR2-6, according to the N second defect maps. Each repairing group includes at least one repairing electronic unit 12.

For example, in each group, repairing groups in at least an equal number of the first defect maps in the group may be provided according to the second defect maps. The repairing groups corresponding to the same group have the same location distribution of repairing electronic units 12, and the location distribution corresponds to the defect distribution of the second defect map in the group. In addition, the number of repairing electronic units 12 in each repairing group is less than the number of backup bonding regions RR in each transfer region (see FIG. 2A to FIG. 2C).

Taking FIG. 1C as an example, the group G1 includes 3 first defect maps, so 3 repairing groups, for example, the repairing group MR1-1, the repairing group MR1-2, and the repairing group MR1-3, may be provided according to the second defect map M2-1 in the group G1. The repairing group MR1-1, the repairing group MR1-2, and the repairing group MR1-3 are respectively configured to repair the transfer region Z1, the transfer region Z6, and the transfer region Z7, for example. The repairing group MR1-1, the repairing group MR1-2, and the repairing group MR1-3 have the same location distribution of repairing electronic units 12, and the location distribution is consistent with the defect distribution of the second defect map M2-1 in the group G1. For example, the second defect map M2-1 includes at least one defect location (e.g., three defect locations, see the crossed boxes), and a location of the repairing electronic unit 12 of any one of the three repairing groups corresponds to the defect location. In addition, the number (which is 3, for example) of repairing electronic units 12 in any one of the repairing group MR1-1, the repairing group MR1-2, and the repairing group MR1-3 is less than the number (which is 16, for example) of backup bonding regions RR (see FIG. 2A to FIG. 2C) in each of the transfer regions (e.g., the transfer region Z1, the transfer region Z6, or the transfer region Z7).

Comparatively, the group G2 includes 6 first defect maps, so 6 repairing groups, for example, the repairing group MR2-1, the repairing group MR2-2, the repairing group MR2-3, the repairing group MR2-4, the repairing group MR2-5, and the repairing group MR2-6, may be provided according to the second defect map M2-2 in the group G2. The repairing group MR2-1, the repairing group MR2-2, the repairing group MR2-3, the repairing group MR2-4, the repairing group MR2-5, and the repairing group MR2-6 are respectively configured to repair the transfer region Z3, the transfer region Z5, the transfer region Z8, the transfer region Z9, the transfer region Z10, and the transfer region Z11, for example. The repairing group MR2-1, the repairing group MR2-2, the repairing group MR2-3, the repairing group MR2-4, the repairing group MR2-5, and the repairing group MR2-6 have the same location distribution of repairing electronic units 12, and the location distribution is consistent with the defect distribution of the second defect map M2-2 in the group G2. For example, the second defect map M2-2 includes at least one defect location (e.g., 9 defect locations, see the crossed boxes), and a location of the repairing electronic unit 12 of any one of the 6 repairing groups corresponds to the defect location. In addition, the number (which is 9, for example) of repairing electronic units 12 in any one of the repairing group MR2-1, the repairing group MR2-2, the repairing group MR2-3, the repairing group MR2-4, the repairing group MR2-5, and the repairing group MR2-6 is less than the number (which is 16, for example) of backup bonding regions RR (see FIG. 2A to FIG. 2C) in each of the transfer regions (e.g., the transfer region Z3, the transfer region Z5, the transfer region Z8, the transfer region Z9, the transfer region Z10, and the transfer region Z11).

Figure 1D:
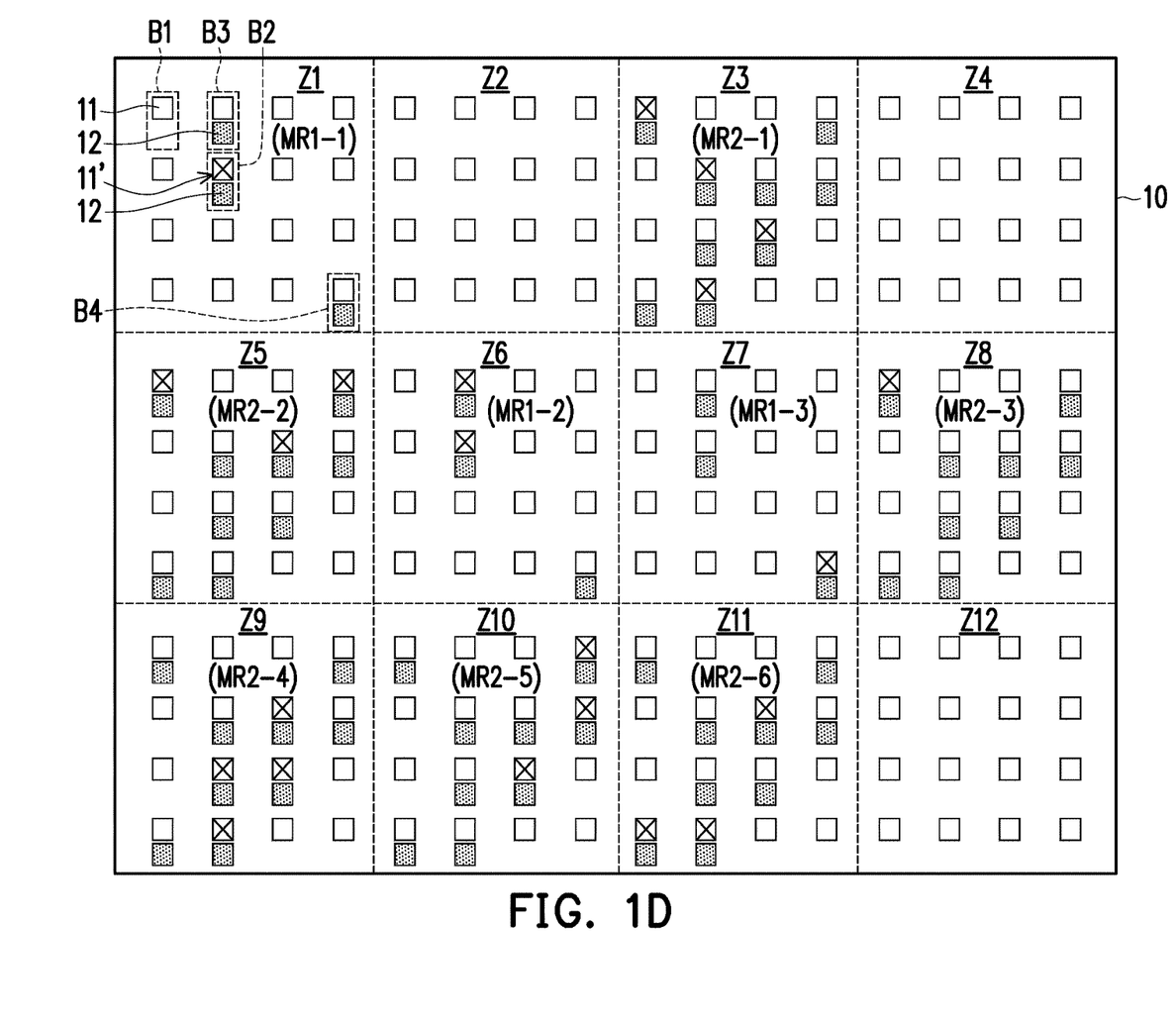
Figure 1E:
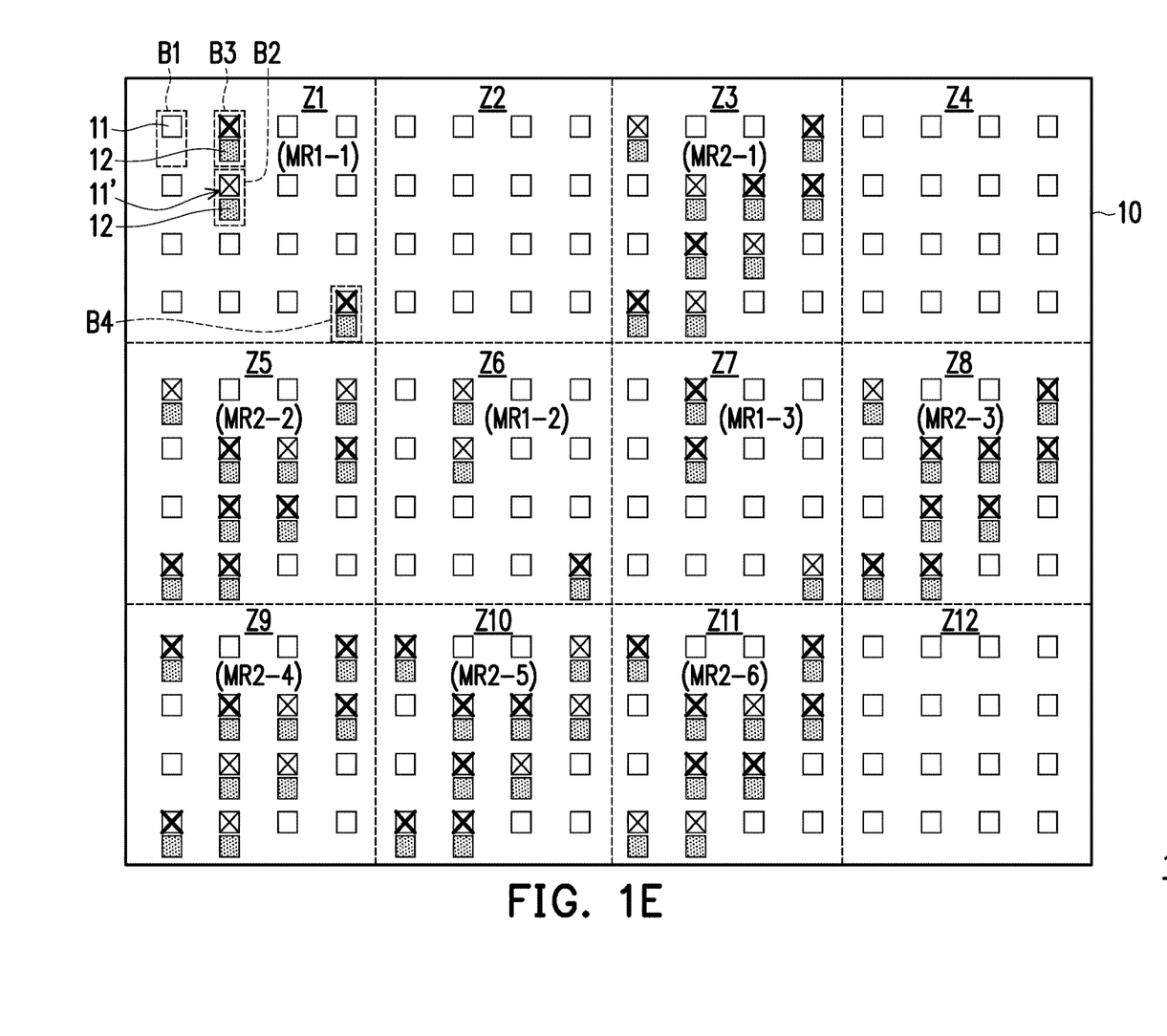

With reference to FIG. 1D, the manufacturing method of an electronic device may further include transferring M repairing groups to the substrate 10. In some embodiments, although not shown in FIG. 1D, at least one repairing group is transferred from a carrier to the substrate 10 by a transfer head. The transfer head transferring the repairing group may be different from the transfer head transferring the electronic unit 11, and the carrier carrying the repairing electronic unit 12 may be the same as or different from the carrier carrying the electronic unit 11. Specifically, the repairing electronic unit 12 and the electronic unit 11 may be the same type of electronic unit and may be carried on the same carrier or different carriers. The repairing electronic unit 12 and the electronic unit 11 are each a LED, for example but not limited to, a mini LED or a micro LED, for providing a light beam.

These electronic units of the same type are referred to by different names of elements used herein to distinguish electronic units formed on the substrate 10 at different stages, but these electronic units may serve the same purpose. For example, when serving as backlight, the electronic units 11 and the repairing electronic units 12 may each be a blue LED, but not limited thereto. Comparatively, when serving as a display pixel, any one of the electronic units 11 and the repairing electronic units 12 may include a plurality of red LEDs, a plurality of green LEDs, and a plurality of blue LEDs, and the electronic unit 11 and the repairing electronic unit 12 disposed on the same bonding region (e.g., the bonding region B1, the bonding region B2, or the bonding region B3) are LEDs of the same color.

The transferring the M (e.g., 9) repairing groups to the substrate 10 is by, for example, mass transfer where the repairing electronic units 12 of the M repairing groups are transferred to a plurality of backup bonding regions RR in the corresponding M transfer regions by a plurality of transfer heads (e.g., 9 or more transfer heads; not shown) in batches, such that each repairing electronic unit 12 is electrically connected to one corresponding pad P1 and one corresponding pad P2, as shown in FIG. 2B or FIG. 2C. Taking FIG. 1D as an example, each transfer head may transfer one repairing group to one transfer region at one time, and 9 transfer heads may transfer 9 repairing groups (including the repairing group MR1-1, the repairing group MR1-2, the repairing group MR1-3, the repairing group MR2-1, the repairing group MR2-2, the repairing group MR2-3, the repairing group MR2-4, the repairing group MR2-5, and the repairing group MR2-6) to a plurality of backup bonding regions RR in 9 transfer regions (including the transfer region Z1, the transfer region Z6, the transfer region Z7, the transfer region Z3, the transfer region Z5, the transfer region Z8, the transfer region Z9, the transfer region Z10, and the transfer region Z11) in batches.

During such repairing, if a repairing electronic unit 12 cannot be lit up due to defective transfer, a second repairing may be performed. For example, in the case of presence of a plurality of backup bonding regions RR in the bonding region, another repairing electronic unit 12 may be disposed on an adjacent backup bonding region RR in the same bonding region. Comparatively, the defective repairing electronic unit 12 may also be removed, and another repairing electronic unit 12 may be disposed, by another transfer head, on the backup bonding region RR where the original defective repairing electronic unit 12 is disposed.

During preparation of transfer heads, if at least 2 transfer heads are to be prepared for each transfer region based on the consideration of a transfer defective rate, a transfer head defective rate, or the like, at least 24 transfer heads are required to be prepared for 12 transfer regions. In the embodiments of the disclosure, by the design of obtaining the defect maps, integrating the defect maps, and providing the repairing groups according to the integrated defect map, the number of transfer heads to be prepared can be reduced. Taking FIG. 1C as an example, the group G1 includes 3 repairing groups (the repairing group MR1-1, the repairing group MR1-2, and the repairing group MR1-3). If the case of a smooth transfer, the 3 repairing groups may be transferred to the transfer region Z1, the transfer region Z6, and the transfer region Z7 by 3 transfer heads. Nonetheless, based on the consideration of a transfer defective rate, a transfer head defective rate, or the like, four transfer heads may be prepared if the comprehensive defective rate is 30%. Comparatively, the group G2 includes 6 repairing groups (the repairing group MR2-1, the repairing group MR2-2, the repairing group MR2-3, the repairing group MR2-4, the repairing group MR2-5, and the repairing group MR2-6). If the case of a smooth transfer, the 6 repairing groups may be transferred to the transfer region Z3, the transfer region Z5, the transfer region Z8, the transfer region Z9, the transfer region Z10, and the transfer region Z11 by 6 transfer heads. Nonetheless, based on the consideration of a transfer defective rate, a transfer head defective rate, or the like, 8 transfer heads may be prepared if the comprehensive defective rate is 30%. In other words, the number of transfer heads to be prepared may be reduced from 24 to 12, helping improve the production efficiency or reduce the management difficulty. It should be understood that the description above is exemplary, and is not intended to limit the disclosure. According to different embodiments, as the number of transfer regions increases, the number of transfer heads to be prepared may be further reduced.

After the M repairing groups are transferred to the substrate 10, as shown in FIG. 1D, both the electronic unit 11 and the repairing electronic unit 12 are present in some of the bonding regions (e.g., the bonding region B2, the bonding region B3, and the bonding region B4). In the bonding region B3 and/or the bonding region B4, both the electronic unit 11 and the repairing electronic unit 12 may be lit up. Under this architecture, one of the electronic unit 11 and the repairing electronic unit 12 may be disabled to independently light up the other of the electronic unit 11 and the repairing electronic unit 12. For example, the manufacturing method of an electronic device may further include identifying the repairing electronic unit 12 in the M repairing groups that is inconsistent with a defect distribution in the M first defect maps, and disabling the repairing electronic unit 12 that is inconsistent or the electronic unit 11 adjacent to the repairing electronic unit 12 that is inconsistent.

Take the repairing group MR1-1 as an example, the repairing electronic unit 12 corresponding to the bonding region B3 and the bonding region B4 is inconsistent with a defect distribution in the first defect map M1-1. Accordingly, the repairing electronic unit 12 or the electronic unit 11 corresponding to the bonding region B3 and the bonding region B4 may be disabled. FIG. 1E schematically shows an embodiment where a plurality of (e.g., 41) electronic units 11 are disabled (indicated by thick-solid-line crosses). Nonetheless, the disclosure is not limited thereto. For example, the repairing electronic unit 12 of the bonding region B3 and/or the bonding region B4 may also be disabled. With reference to FIG. 2C, the disabling the electronic units 11 corresponding to the bonding region B3 and the bonding region B4 may be performed through laser cutting LC. For example, the lead wire C1 may be cut off by laser irradiating the lead wire C1 electrically connected to the electronic unit 11 to disable the electronic unit 11. In other embodiments, although not shown, the lead wire C1 may be cut off by laser irradiating the lead wire C1 electrically connected to the repairing electronic unit 12 to disable the repairing electronic unit 12. According to some embodiments, the manufacturing method of an electronic device may further include identifying the repairing electronic unit 12 in the M repairing groups that is consistent with the defect distribution in the M first defect maps, and cutting off the lead wire C1 electrically connected to the electronic unit 11 (e.g., the electronic unit 11 in the bonding region B2) adjacent to the repairing electronic unit 12 that is consistent through laser cutting LC to avoid short circuits, as shown in FIG. 2B.

With reference to FIG. 1E, an electronic device 1 may include the substrate 10, a plurality of electronic unit groups (e.g., groups formed of the electronic units 11 arranged into a 4*4 array), and at least two of the repairing groups (e.g., the repairing group MR1-1, the repairing group MR1-2, the repairing group MR1-3, the repairing group MR2-1, the repairing group MR2-2, the repairing group MR2-3, the repairing group MR2-4, the repairing group MR2-5, and the repairing group MR2-6). The substrate 10 includes a plurality of transfer regions (e.g., the transfer region Z1 to the transfer region Z12). The transfer regions include a plurality of bonding regions (e.g., 192 bonding regions; FIG. 1E schematically shows the bonding region B1 to the bonding region B4). With reference to FIG. 1E and FIG. 2A to FIG. 2C, each bonding region includes the main bonding region MR and the backup bonding region RR. The electronic unit groups are respectively disposed on the transfer regions, and the electronic unit groups include the electronic units 11 respectively bonded to the main bonding regions MR. The at least two repairing groups are respectively disposed on at least two transfer regions (FIG. 1E schematically shows 9 repairing groups respectively disposed on 9 transfer regions), and each repairing group includes at least one repairing electronic unit 12 bonded to at least one backup bonding region RR. The at least two repairing groups have the same location distribution of repairing electronic units 12 (e.g., the repairing group MR1-1, the repairing group MR1-2, and the repairing group MR1-3 have the same location distribution of repairing electronic units 12, and the repairing group MR2-1, the repairing group MR2-2, the repairing group MR2-3, the repairing group MR2-4, the repairing group MR2-5, and the repairing group MR2-6 have the same location distribution of repairing electronic units 12). In addition, the number of repairing electronic units 12 in each repairing group is less than the number of backup bonding regions RR in each transfer region.

According to some embodiments, the electronic unit 11 and the repairing electronic unit 12 are respectively disposed on the main bonding region MR and the backup bonding region RR of at least one bonding region (e.g., the bonding region B2, the bonding region B3, or the bonding region B4). In addition, the circuit (e.g., the lead wire C1) electrically connected to one of the electronic unit 11 and the repairing electronic unit 12 has a laser cutting trace T (see FIG. 2B or FIG. 2C).

In summary of the foregoing, in the embodiments of the disclosure, by the design of obtaining the defect maps, integrating the defect maps, and providing the repairing groups according to the integrated defect map, the number of transfer heads to be prepared can be reduced, helping improve the production efficiency or reduce the management difficulty.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

Although the embodiments and the advantages thereof have been disclosed as above, it should be understood that, a person skilled in the art may make variations, replacements, and modifications, and features among the embodiments may be arbitrarily mixed and replaced with each other into other newly formed embodiments without departing from the spirit and scope of the disclosure. In addition, the protection scope of the disclosure is not limited to the process, machine, manufacture, composition of matters, device, method, or step in the specifically described embodiments in the description. A person skilled in the art can understand from the content of the disclosure that the existing or to-be-developed process, machine, manufacture, composition of matters, device, method, or step may be used according to the disclosure as long as the substantially same function can be implemented or the substantially same result can be obtained in the embodiments described herein. Therefore, the protection scope of the disclosure includes the above-mentioned process, machine, manufacture, composition of matters, device, method, or step. Moreover, each claim forms an individual embodiment, and the protection scope of the disclosure also includes a combination of each of the claims and embodiments. The protection scope of the disclosure should be subject to the appended claims.

What is claimed is:

1. A manufacturing method of an electronic device comprising:
    providing a substrate;
    transferring a plurality of electronic units to the substrate;
    inspecting the electronic units to obtain M first defect maps;
    integrating the M first defect maps into N second defect maps, where N<M;
    providing M repairing groups according to the N second defect maps, wherein each of the repairing groups comprises at least one repairing electronic unit; and
    transferring a plurality of repairing electronic units of the M repairing groups to the substrate;
    wherein at least two of the repairing groups have the same location distribution of repairing electronic units, and the location distribution is consistent with a defect distribution of one of the second defect maps, and
    wherein the substrate comprises M' transfer regions, the electronic units comprise a plurality of electronic unit groups, and the electronic unit groups are respectively transferred to the M' transfer regions, wherein the M first defect maps correspond to M transfer regions among the M' transfer regions, where M≤M'.

2. The manufacturing method according to claim 1, wherein the second defect maps comprise at least one defect location, and a location of the repairing electronic unit corresponds to the defect location.

3. The manufacturing method according to claim 1, further comprising:
    identifying, in the M repairing groups, the repairing electronic unit being inconsistent with a defect distribution in the M first defect maps; and
    disabling the repairing electronic unit being inconsistent or the electronic unit adjacent to the repairing electronic unit being inconsistent.

4. The manufacturing method according to claim 3, wherein the disabling is performed through laser cutting.

5. The manufacturing method according to claim 1, wherein the defect distribution of one of the second defect maps is a union of defect distributions of at least two of the first defect maps.

6. The manufacturing method according to claim 1, wherein the substrate comprises a plurality of main bonding regions and a plurality of backup bonding regions, wherein the electronic units are transferred to the main bonding regions, and the repairing electronic units are transferred to the backup bonding regions.

7. The manufacturing method according to claim 1, wherein at least one of the electronic units is transferred from a carrier to the substrate by a transfer head.

8. The manufacturing method according to claim 7, wherein at least one of the repairing electronic units is transferred from the same carrier or a different carrier to the substrate by another transfer head.

9. The manufacturing method according to claim 1, wherein inspecting the electronic units comprises performing a light-up test on the electronic units to determine locations of defects.

10. The manufacturing method according to claim 9, wherein the number of the repairing electronic units transferred to the substrate is greater than the number of the defects.

11. A manufacturing method of an electronic device comprising:
    providing a substrate;
    transferring a plurality of electronic units to the substrate;
    inspecting the electronic units to obtain M first defect maps;
    integrating the M first defect maps into N second defect maps, where N<M;
    providing M repairing groups according to the N second defect maps, wherein each of the repairing groups comprises at least one repairing electronic unit; and
    transferring a plurality of repairing electronic units of the M repairing groups to the substrate;
    wherein at least two of the repairing groups have the same location distribution of repairing electronic units, and the location distribution is consistent with a defect distribution of one of the second defect maps, and
    wherein integrating the M first defect maps into the N second defect maps comprises:
    dividing the M first defect maps into N groups, and each of the groups comprises K first defect maps, where 1<K<M; and integrating the K first defect maps in each of the groups to obtain the N second defect maps, wherein a defect distribution of each of the second defect maps is a union of defect distributions of the K first defect maps in the corresponding group.

12. The manufacturing method according to claim 11, wherein the M first defect maps are divided into the N groups according to the number of defects, repetition of defect locations, or production efficiency.

13. The manufacturing method according to claim 11, wherein the N groups comprise a first group and a second group, and the number of the first defect maps in the first group is different from the number of the first defect maps in the second group.

14. The manufacturing method according to claim 11, wherein providing the M repairing groups according to the N second defect maps comprises:
providing the repairing groups in an equal number according to the K first defect maps in the groups.

15. The manufacturing method according to claim 14, wherein the repairing groups corresponding to the same group have the same location distribution of repairing electronic units, and the location distribution is consistent with a defect distribution of the second defect map corresponding to the group.

16. An electronic device comprising:
a substrate comprising M' transfer regions, each of the M' transfer regions comprising a plurality of bonding regions, each of the bonding regions comprising a main bonding region and a backup bonding region;
M' electronic unit groups respectively disposed on the M' transfer regions, each of the M' electronic unit groups comprising a plurality of electronic units respectively bonded to the main bonding regions; and
M repairing groups respectively disposed on M transfer regions among the M' transfer regions, wherein M≤M', and each of the M repairing groups comprises at least one repairing electronic unit bonded to at least one of the backup bonding regions;
wherein at least two of the M repairing groups have the same location distribution of repairing electronic units, and the number of the repairing electronic units in each of the M repairing groups is less than the number of the backup bonding regions in each of the M' transfer regions.

17. The electronic device according to claim 16, wherein the electronic unit and the repairing electronic unit are respectively disposed on the main bonding region and the backup bonding region of at least one of the bonding regions, and a circuit electrically connected to one of the electronic unit and the repairing electronic unit has a laser cutting trace.

18. The electronic device according to claim 16, wherein at least two of the M repairing groups comprise a plurality of first repairing groups and a plurality of second repairing groups, and the first repairing groups and the second repairing groups have different location distributions of repairing electronic units.

19. The electronic device according to claim 18, wherein the first repairing group and the second repairing group have different numbers of repairing electronic units.

* * * * *